(12) United States Patent
Iwasaki

(10) Patent No.: US 9,396,789 B2
(45) Date of Patent: Jul. 19, 2016

(54) MEMORY CONTROL DEVICE AND A DELAY CONTROLLER

(71) Applicant: Keiichi Iwasaki, Kanagawa (JP)

(72) Inventor: Keiichi Iwasaki, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/879,925

(22) Filed: Oct. 9, 2015

(65) Prior Publication Data

US 2016/0035408 A1    Feb. 4, 2016

Related U.S. Application Data

(63) Continuation of application No. 14/302,044, filed on Jun. 11, 2014, now abandoned.

(30) Foreign Application Priority Data

Jun. 11, 2013 (JP) ................................. 2013-122353

(51) Int. Cl.
| | | |
|---|---|---|
| *G11C 11/4096* | (2006.01) | |
| *G11C 11/40* | (2006.01) | |
| *G11C 11/406* | (2006.01) | |
| *G11C 11/4076* | (2006.01) | |
| *G06F 13/42* | (2006.01) | |
| *G11C 7/04* | (2006.01) | |
| *G11C 7/22* | (2006.01) | |

(52) U.S. Cl.
CPC ............ *G11C 11/4076* (2013.01); *G06F 13/42* (2013.01); *G11C 7/04* (2013.01); *G11C 7/222* (2013.01); *G11C 11/406* (2013.01); *G11C 11/4096* (2013.01); *G11C 11/40611* (2013.01); *G11C 2207/2254* (2013.01)

(58) Field of Classification Search
CPC ........ G11C 7/222; G11C 7/22; G11C 7/1066; G11C 11/4076; G11C 7/1072; G11C 2207/2254; G11C 29/023; G11C 7/1078; G11C 7/1093; G11C 29/50012; G11C 7/1057; G11C 7/225; G11C 2207/2272; G11C 2211/4061; G11C 7/1084; G11C 29/12015; G11C 16/32; G11C 7/04

See application file for complete search history.

(56) References Cited

U.S. PATENT DOCUMENTS

| | | | | |
|---|---|---|---|---|
| 6,493,378 B1 * | 12/2002 | Zhodzishsky | ........... | G01S 19/22 375/149 |
| 6,842,396 B2 * | 1/2005 | Kono | ................... | G11C 7/1066 365/189.14 |
| 6,960,952 B2 * | 11/2005 | Nguyen | .............. | H04L 25/0288 327/175 |
| 6,970,028 B2 * | 11/2005 | Ishikawa | ............... | H03L 7/0814 327/149 |
| 7,111,111 B2 * | 9/2006 | Neuman | .............. | G11C 7/1051 711/105 |

(Continued)

*Primary Examiner* — Hoai V Ho
*Assistant Examiner* — Roberto Mancera
(74) *Attorney, Agent, or Firm* — Oblon, McClelland, Maier & Neustadt, L.L.P

(57) ABSTRACT

A memory control device includes a plurality of delay circuits to set a delay value for each terminal of a memory, each of the plurality of delay circuits being connected to a terminal of the memory. Further, the memory control device includes a first register to store a first DLL value output by a delay locked loop circuit, a plurality of second registers to store a first setting value to set the delay value for the each terminal of the memory, each of the plurality of second registers being connected to a delay circuit of the plurality of delay circuits, and a delay controller to calculate a second setting value based on the first DLL value, a second DLL value output by the delay locked loop circuit after the first DLL value, and the first setting value, and to update the first setting value to the second setting value.

10 Claims, 4 Drawing Sheets

(56) References Cited

U.S. PATENT DOCUMENTS

| | | | | |
|---|---|---|---|---|
| 7,145,373 B2* | | 12/2006 | Jaussi | H03K 5/133 327/158 |
| 7,177,199 B2* | | 2/2007 | Chen | G11C 11/5628 365/185.11 |
| 7,191,279 B2* | | 3/2007 | Kumar | G11C 7/1051 711/105 |
| 7,348,819 B2* | | 3/2008 | Choi | G11C 7/1072 327/149 |
| 7,378,888 B2* | | 5/2008 | Sato | H03L 7/0812 327/149 |
| 7,433,241 B2* | | 10/2008 | Dong | G11C 11/5628 365/185.17 |
| 7,440,322 B2* | | 10/2008 | Kamei | G11C 16/0483 365/185.17 |
| 7,450,430 B2* | | 11/2008 | Hemink | G11C 11/5628 365/185.17 |
| 7,457,166 B2* | | 11/2008 | Hemink | G11C 11/5635 365/185.18 |
| 7,463,531 B2* | | 12/2008 | Hemink | G11C 11/5628 365/185.17 |
| 7,468,918 B2* | | 12/2008 | Dong | G11C 11/5628 365/185.17 |
| 7,501,866 B2* | | 3/2009 | Choi | G11C 7/1072 327/108 |
| 7,522,457 B2* | | 4/2009 | Hemink | G11C 16/344 365/185.22 |
| 7,579,889 B2* | | 8/2009 | Yang | H03L 7/0812 327/152 |
| 7,605,622 B2* | | 10/2009 | Choi | G06F 7/68 327/149 |
| 7,773,429 B2* | | 8/2010 | Jeon | G11C 11/5621 365/185.17 |
| 7,869,287 B2* | | 1/2011 | Searles | G11C 7/1051 365/193 |
| 7,876,137 B2* | | 1/2011 | Heightley | G11C 7/1051 327/158 |
| 7,929,361 B2* | | 4/2011 | Searles | G11C 7/1051 365/193 |
| 8,026,544 B2* | | 9/2011 | Ito | G11C 11/5621 257/321 |
| 8,049,545 B2* | | 11/2011 | Kim | H03K 5/1565 327/149 |
| 8,194,461 B2* | | 6/2012 | Kosaki | G11C 11/5628 365/185.02 |
| 8,278,170 B2* | | 10/2012 | Lee | H01L 27/11551 257/E21.645 |
| 8,384,455 B2* | | 2/2013 | Lee | H03L 7/07 327/149 |
| 8,441,858 B2* | | 5/2013 | Sarin | G11C 16/0483 365/185.17 |
| 8,638,608 B2* | | 1/2014 | Lai | G11C 11/5628 365/185.17 |
| 8,819,475 B2* | | 8/2014 | Iijima | G06F 1/10 713/503 |
| 8,958,249 B2* | | 2/2015 | Dutta | G11C 16/14 365/185.03 |
| 8,982,626 B2* | | 3/2015 | Dong | G11C 11/5642 365/185.17 |
| 8,982,637 B1* | | 3/2015 | Dong | G11C 16/26 365/185.18 |
| 9,047,237 B2* | | 6/2015 | Hasan | G06F 13/16 |
| 2004/0174748 A1* | 9/2004 | Lutze | G11C 16/3418 365/185.28 |
| 2005/0219896 A1* | 10/2005 | Chen | G11C 16/3459 365/185.03 |
| 2005/0248988 A1* | 11/2005 | Guterman | G11C 16/0483 365/185.28 |
| 2005/0248989 A1* | 11/2005 | Guterman | G11C 16/30 365/185.28 |
| 2005/0276108 A1* | 12/2005 | Guterman | G11C 16/10 365/185.18 |
| 2006/0120165 A1* | 6/2006 | Hemink | G11C 11/5628 365/185.28 |
| 2006/0221709 A1* | 10/2006 | Hemink | G11C 11/5628 365/185.29 |
| 2006/0279990 A1* | 12/2006 | Wan | G11C 16/3418 365/185.17 |
| 2008/0013360 A1* | 1/2008 | Hemink | G11C 11/5635 365/100 |
| 2008/0019164 A1* | 1/2008 | Hemink | G11C 16/344 365/100 |
| 2008/0084751 A1* | 4/2008 | Li | G11C 11/5628 365/185.19 |
| 2008/0084752 A1* | 4/2008 | Li | G11C 11/5628 365/185.19 |
| 2008/0089133 A1* | 4/2008 | Ito | G11C 8/10 365/185.22 |
| 2008/0101126 A1* | 5/2008 | Hemink | G11C 11/5628 365/185.19 |
| 2008/0117683 A1* | 5/2008 | Hemink | G11C 11/5621 365/185.19 |
| 2008/0117684 A1* | 5/2008 | Hemink | G11C 11/5628 365/185.19 |
| 2008/0123436 A1* | 5/2008 | Byeon | G11C 11/5635 365/185.29 |
| 2008/0266978 A1* | 10/2008 | Goda | G11C 11/5628 365/185.26 |
| 2009/0003054 A1* | 1/2009 | Hung | G11C 11/5671 365/185.03 |
| 2009/0027959 A1* | 1/2009 | Lee | G11C 11/5628 365/185.03 |
| 2010/0014349 A1* | 1/2010 | Mokhlesi | G11C 11/5628 365/185.03 |
| 2010/0074025 A1* | 3/2010 | Park | G11C 16/3454 365/185.19 |
| 2010/0097863 A1* | 4/2010 | Kim | G11C 11/5628 365/185.18 |
| 2010/0128523 A1* | 5/2010 | Yip | G11C 11/5628 365/185.03 |
| 2010/0321998 A1* | 12/2010 | Jang | G11C 11/5628 365/185.03 |
| 2011/0058424 A1* | 3/2011 | Goda | G11C 11/5628 365/185.19 |
| 2011/0134702 A1* | 6/2011 | Imondi | G11C 11/5628 365/185.19 |
| 2011/0292724 A1* | 12/2011 | Kim | G11C 16/0483 365/185.03 |
| 2012/0092931 A1* | 4/2012 | Edahiro | G11C 16/3459 365/185.17 |
| 2013/0301352 A1* | 11/2013 | Shim | G11C 16/10 365/185.03 |
| 2014/0269057 A1* | 9/2014 | Shereshevski | G11C 16/10 365/185.03 |
| 2014/0362641 A1* | 12/2014 | Dong | G11C 11/5642 365/185.17 |

\* cited by examiner

MEMORY CONTROL DEVICE AND A DELAY CONTROLLER

CROSS REFERENCE TO RELATED APPLICATIONS

This application is a continuation application of U.S. application Ser. No. 14/302,044, filed Jun. 11, 2014, which claims the benefit of priority under 35 U.S.C. §119 from Japanese Patent Application No. 2013-122353, filed Jun. 11, 2013, the entire contents of each of which are incorporated herein by reference.

BACKGROUND

1. Field

The present invention relates to a source synchronous system and in particular, a memory controller that controls a Double Data Rate Synchronous Dynamic Random Access Memory (DDR SDRAM) that is a dynamic random access memory (DRAM) with a high bandwidth ("double data rate") interface.

2. Background of the Related Art

When the read-write operation in the DDR SDRAM that transmits data in the source synchronous system occurs, a Data Signal (DQ) and Data Strobe Signal (DQS) are transmitted and received between a memory and a memory controller. In such a case, some memory controllers are known to control the delay of the data signal (DQ) and the data strobe signal (DQS).

In computing, Double Data Rate type "three" Synchronous Dynamic Random Access Memory (DDR3 SDRAM) is a modern type of dynamic random access memory (DRAM) that is the higher-speed successor to the DDR and the Double Data Rate type "two" Synchronous Dynamic Random Access Memory (DDR2).

The DDR3 SDRAM adopts "Fly-by Topology" routing the signals in a daisy-chained fashion to improve signal integrity. However, the fly-by topology causes a skew because fly-by topology introduces differences in the wiring length between the memory controller and the memory.

The DDR3 SDRAM has the ability to assist the delay adjustment for reducing the skew. For example, the delay is adjusted by a Write Leveling (WL) command or a command that has an output function of a fixed data (for example, a "predefined pattern" that is defined in the Mode Register 3 (MR3)). Further, it is necessary to set a different delay value to each terminal of the memory controller.

It is possible that only during the initialization of the system, the memory controller can control the WL command and the command that has the output function of a fixed data in the DDR3 SDRAM, and set the delay value separately for each input/output terminal of the memory controller.

However, in the above conventional technique, the transmission of commands are stopped/delayed during a period of read and/or write to the memory and the performance of the system decreases if the memory controller performs the correction for the delay in the same way as the initialization (for example, the WL command) when environmental changes occur after initialization, for example, due to fluctuations in power supply voltage and temperature fluctuations.

SUMMARY

In an aspect of the disclosure, there is provided a memory control device. The memory control device includes a plurality of delay circuits to set a delay value for each terminal of a memory, each of the plurality of delay circuits being connected to a terminal of the memory.

Further, the memory control device includes a first register to store a first DLL value output by a delay locked loop circuit, a plurality of second registers to store a first setting value to set the delay value for the each terminal of the memory, each of the plurality of second registers being connected to a delay circuit of the plurality of delay circuits, and a delay controller to calculate a second setting value based on the first DLL value, a second DLL value output by the delay locked loop circuit after the first DLL value, and the first setting value, and to update the first setting value to the second setting value.

As a result, the memory control device is capable of performing a delay correction without reducing performance of a system including the memory control device.

DETAILED DESCRIPTION

In systems with DDR3 SDRAM, it is often required to control delay signals with high accuracy, for example, to check whether a current delay value is appropriate or not, regularly or gradually.

In the above case, for example, there is a WL command. The WL command controls the delay values such that each time a clock signal edge and a DQS signal edge reach a memory at approximately the same time.

When a delay value is "k" the clock edge is faster than the DQS edge, and when another delay value is "k+1" (k plus one clock period) the DQS edge is faster than the clock edge. In such condition, either the "k" value or the "k+1" value is set as the appropriate delay value. Repeatedly, the WL commands find the condition regularly and set the appropriate delay value. By repeating the WL commands, the transmission of commands are stopped/delayed during a period of read and/or write to the memory, and the performance of the system decreases.

However, an embodiment of the present disclosure sets forth the concept of calculating a delay value using an output value of a Delay Locked Loop (DLL) circuit as in the following equation (1):

$$B_n = (B_{n-1}/A_{n-1}) \times A_n \qquad (1)$$

In the above equation (1),
$A_{n-1}$ is an output of the DLL set at n−1 times;
$B_{n-1}$ is a delay value set at n−1 times;
$A_n$ is an output of the DLL set at n times; and
$B_n$ is a delay value set at n times.

Note that in the above, n is a natural number equal to or greater than 1. For example, when n=1, B1 is a delay value set at a first time from the initialization. When n=2, B2 is updated from B1.

For example, when n=1, the equation (1) is expressed as the following equation (2):

$$B_1 = (B_0/A_0) \times A_1 \qquad (2)$$

In the above equation (2), $A_0$ is an output of the DLL set at the initialization;

$B_0$ is a delay value set at the initialization;

$A_1$ is an output of the DLL set at a first time from the initialization; and $B_1$ is a delay value set at a first time from the initialization.

Figure 1:
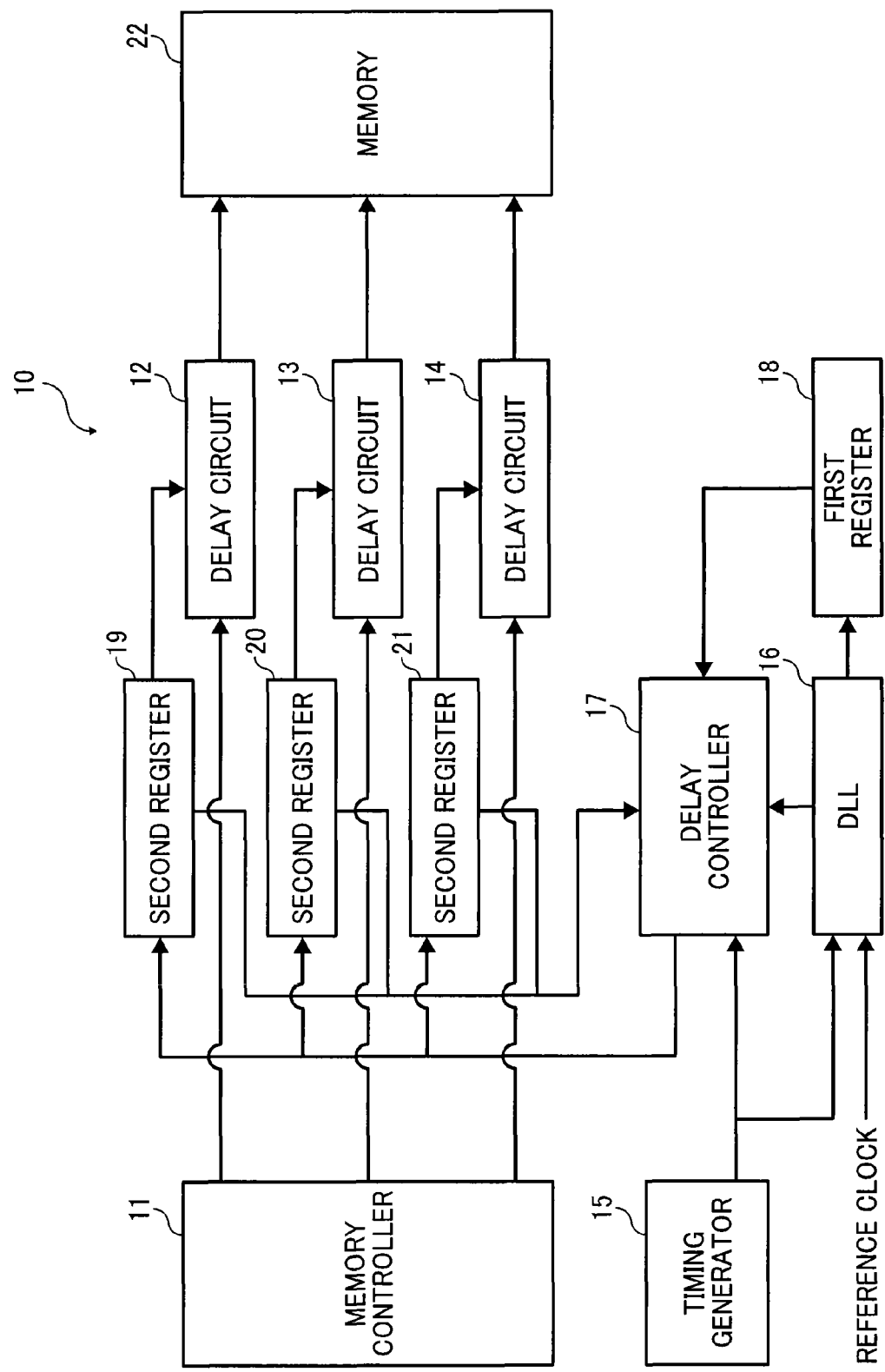
FIG. 1 is a block diagram showing a configuration of a memory control device according to a first embodiment.

FIG. 1 is a block diagram showing the main configuration of the memory control device according to the first embodiment. The memory control device 10 includes a memory controller 11, delay circuits 12, 13, 14, a timing generator 15, a DLL circuit 16, a delay controller 17, a first register 18, second registers 19, 20, 21, and a memory 22.

The memory controller 11 is connected to each of the delay circuits 12, 13, 14. Further, the timing generator 15 is connector to the delay controller 17 and the DLL circuit 16. The DLL circuit 16 is directly connected to the delay controller 17, and is indirectly connected to the delay controller 17 through the first register 18 by using another line.

The delay controller 17 is connected to each of the second registers 19, 20, 21. Moreover, the second registers 19, 20, 21 are respectively connected to the delay circuits 12, 13, and 14. In other words, the second register 19 is connected to the delay circuit 12, the second register 20 is connected to the delay circuit 13, and the second register 21 is connected to the delay circuit 14. Each of the delay circuits 12, 13, 14 is connected to the memory 22.

A reference clock is input to the DLL circuit 16. Each of the delay circuits 12, 13, 14 are connected to a terminal of the memory 22, and set a variable delay value to each terminal of the memory 22.

The DLL circuit 16 includes a delay element to generate delay similarly to the delay generated by the delay circuits 12, 13, 14. An output value of the lock state of the DLL circuit 16 (a first DLL value) is stored in the first register 18 whenever it is output by the DLL circuit 16. An input value (a first or second setting value) to each of the delay circuits 12, 13, 14 setting a delay value for each terminal of the memory 22 is stored in each of the second registers 19, 20, 21.

The delay controller 17 calculates a delay value (a second setting value) based on an output value of the DLL circuit 16 (a first DLL value), the first register value in the first register 18 (a second DLL value), and the second register values (first setting values) in the second registers 19, 20, 21.

In this case, in synchronization with the timing of a calibration run of the DLL circuit 16, the delay controller 17 detects a difference between the first register value of the first register 18 (a first DLL value) and the output value of the DLL circuit 16 (a second DLL value) by comparing them and determines whether or not to perform the calculation of the delay value according to the amount of the difference.

The amount of the difference can be "$\frac{1}{5} * A_0$" when a delay value (a first setting value) having about 20% margin is set at the initialization. The amount of the difference may be one clock period time if high fluency correction is needed.

Further, the delay controller 17 can determine whether or not to perform the calculation of the delay value based on a difference between register values of the second registers 19, 20, 21. In addition, note that the timing generator 15 controls the timing of the calibration run of the DLL circuit 16.

In the present embodiment, the delay values (the second setting values) calculated by the delay controller 17 based on the output value of the DLL circuit 16, the first register values in the first register 18, and the second register values in the second registers 19, 20, 21, are sent to the second registers 19, 20, 21.

The delay controller 17 updates a new second register value (a second setting value) on each of the second registers 19, 20, 21 as an appropriate delay value for each terminal of the memory 22. Note that the memory 22 has a plurality of input/output terminals, but they are omitted in FIG. 1.

The delay value stored at initialization at the second registers 19, 20, 21, is set on the basis of a signal from a processor such as a CPU or a sequencer (not shown).

When the output value is output from the DLL circuit 16, the first register 18 stores the output value at that time. The reference clock input to DLL circuit 16 is set at the same frequency as the clock in the memory 22. The reference clock may be a clock of a double multiplied frequency or a quad multiplied frequency relative to the clock in the memory 22.

Note that a system in which each of a plurality of memories is connected by fly-by topology, can have a different delay for each lane.

As described above, the delay variation that occurs by difference in wiring length of the control signal lines can be offset by setting an appropriate delay value to the control signal line. Therefore, there is no need to wire the same length to all control signals, and it is possible to maintain the same delay value whenever environmental changes occur, for example, due to fluctuations in power supply voltage and temperature fluctuations.

Because the delay controller 17 determines whether or not to perform the calculation of the delay value according to the difference between the first register value of the first register 18 (the first DLL value) and the output value of the DLL circuit 16 (the second DLL value), for example, the delay controller 17 can include a subtractor or an adder with a bit shifter without including a divider or a multiplier.

By repeating the bit-shift operation and adding operation (bit-shift and add, bit-shift and add, bit-shift and add, etc.), the bit-shifter and the adder have the same function as the multiplier. By repeating the bit-shift operation and subtracting operation (bit-shift and subtract, bit-shift and subtract, bit-shift and subtract, etc.), the bit-shifter and the subtractor have the same function as the divider. Note that the divider is larger than both the bit shifter and the subtractor. In addition, note that the multiplier is larger than both the bit shifter and the adder.

Hence, the delay controller 17 has a simple structure in this embodiment.

Further, in this embodiment, a single delay controller 17 is provided for a plurality of second registers 19, 20, 21 to compact the delay controller 17. That is, the the delay value is not updated simultaneously to the plurality of second registers 19, 20, 21. Therefore, the delay controller 17 has a simple structure that can update for the second registers connected one terminal at a time.

Figure 2:
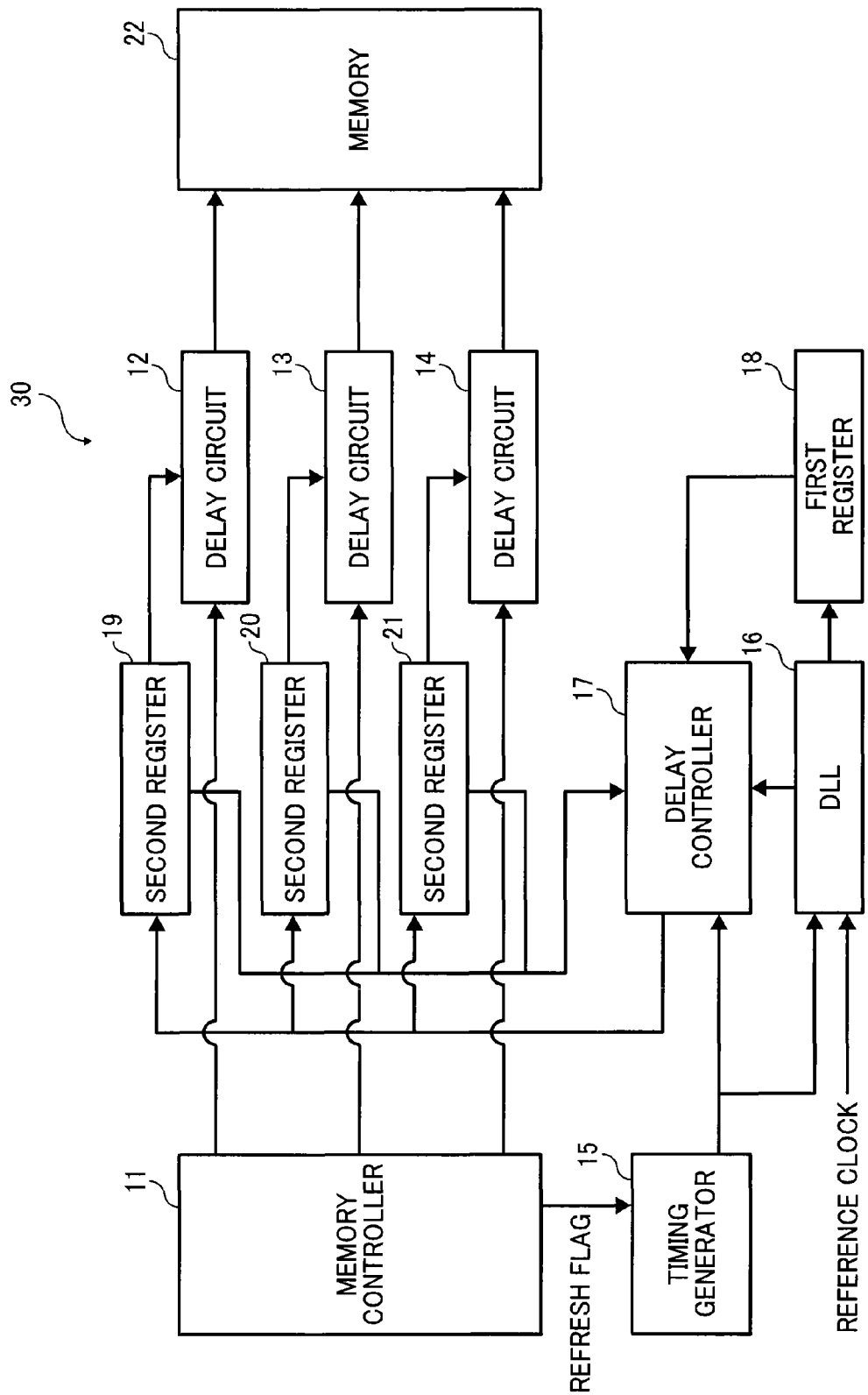
FIG. 2 is a block diagram showing a configuration of a memory control device according to a second embodiment.

FIG. 2 is a block diagram showing the main configuration of the memory control device according to the second embodiment.

In the memory control device 30 of this embodiment, a timing generator 15 and the memory controller 11 are connected to each other, and a signal of a refresh flag is input to the timing generating circuit (generator) 15 from the memory controller 11.

Generally, since charges become zero and data disappears in the SDRAM by self-discharge, the SDRAM needs a refresh operation that electric charges are provided at regular intervals. The signal of the refresh flag is generated when a memory is refreshed. That is, this embodiment describes controlling the delay according to timing of refresh operation.

The timing generator 15 is configured to output a timing signal synchronized with the refresh cycle of the memory 22 based on the refresh flag (in other words, based on every refresh operation) to the delay controller 17. Note that the other elements are the same as in the first embodiment.

When the refresh flag occurs M times (M is a natural number of 2 or more), the delay controller 17 can be operated.

If the difference between the first register value stored in the first register 18 (the first DLL value) and the output value of the DLL circuit 16 (the second DLL value) is not over a maximum difference value, the delay controller 17 does not calculate a delay value. However, if the difference is over the maximum difference value, the delay controller 17 calculates a delay value using the equation (1), and updates the delay value (the second setting value) to a second register when the refresh flag occurs (M+1) times. This operation is performed on the delay setting value of all terminals of the memory 22.

Note that there is no need to update the delay value if the delay value after the calculation is the same as the original delay value.

The maximum difference value is defined as a threshold value to ensure memory operation in a system. For example, a 266 MHz system can have a maximum difference value of 3.75 ns.

According to the embodiment, by synchronizing with the refresh timing, the setting of the delay values can be achieved in a period with no access to the memory (for example, during no read/write)

The delay controller 17 can include a subtractor or an adder with a bit-shifter without including a divider or a multiplier. The bit-shifter and the adder calculate more slowly than the multiplier, and the bit-shifter and the subtractor calculate more slowly than the divider.

Since the refresh cycle (for example, 7.8 microseconds) includes enough time to complete the calculation of bit-shifting, adding, and subtracting, the divider and the multiplier are not essential in this embodiment.

Figure 3:
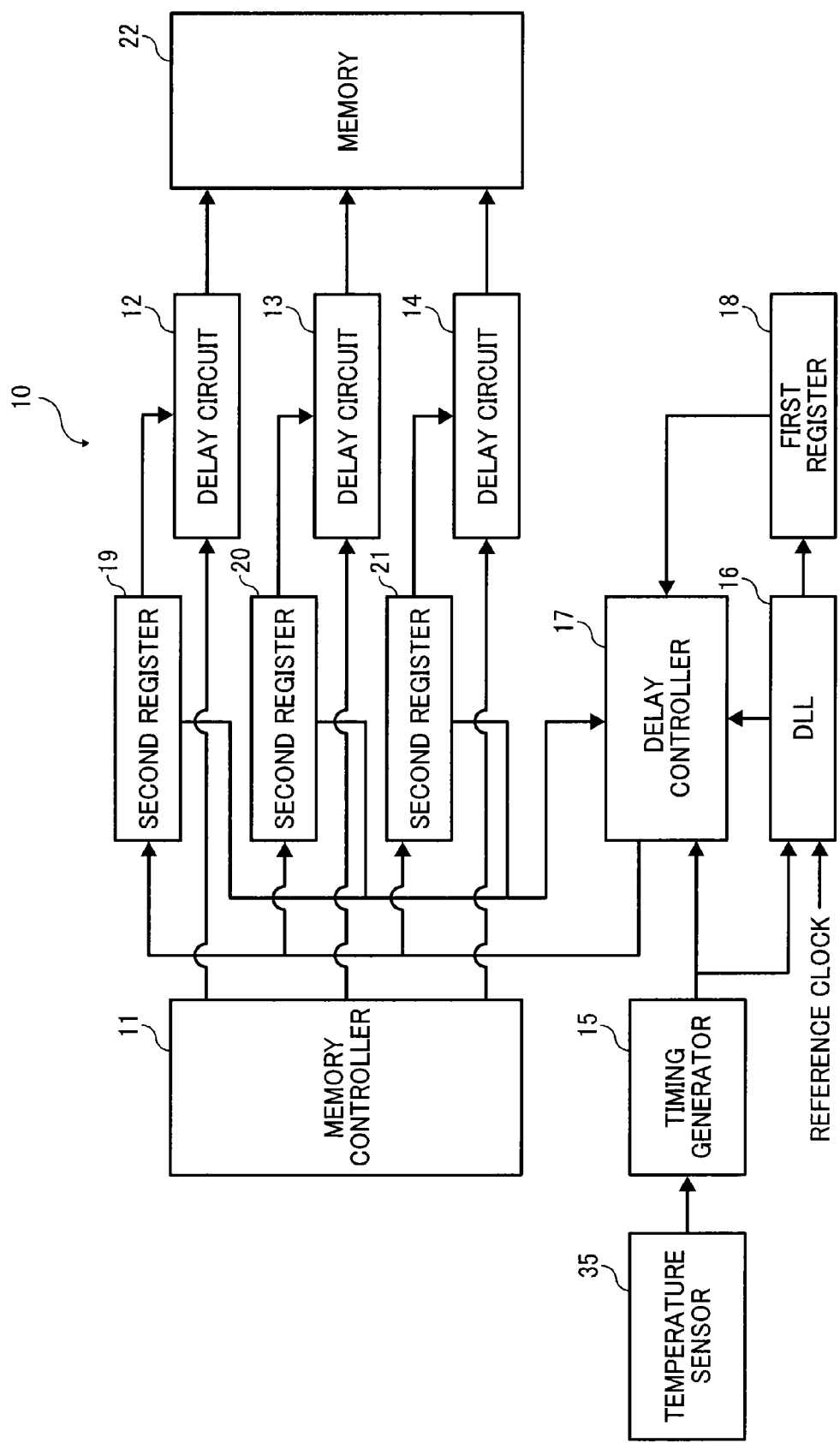
FIG. 3 is a block diagram showing a configuration of a memory control device according to a third embodiment.

FIG. 3 is a block diagram showing the main configuration of the memory control device according to the third embodiment.

In the present embodiment, a temperature sensor 35 is connected to the timing generator 15. An electrical signal (for example, a voltage or current) corresponding to the detected temperature at the temperature sensor 35 is input to the timing generating circuit (generator) 15. The other elements are the same as in the first embodiment.

In the present embodiment, the timing generator 15 controls the timing of the calibration execution of the DLL circuit 16 in response to the temperature value (the electrical signal) detected by the temperature sensor 35.

Since the amount of temperature change is proportional to the delay value, updating the delay value may not be needed if there is a small temperature change.

Thus, by using the temperature sensor 35, it is possible to reduce the number of executions of the DLL calibration and reduce power consumption. Note that this embodiment can also be applied to the configuration shown in the second embodiment.

Figure 4:
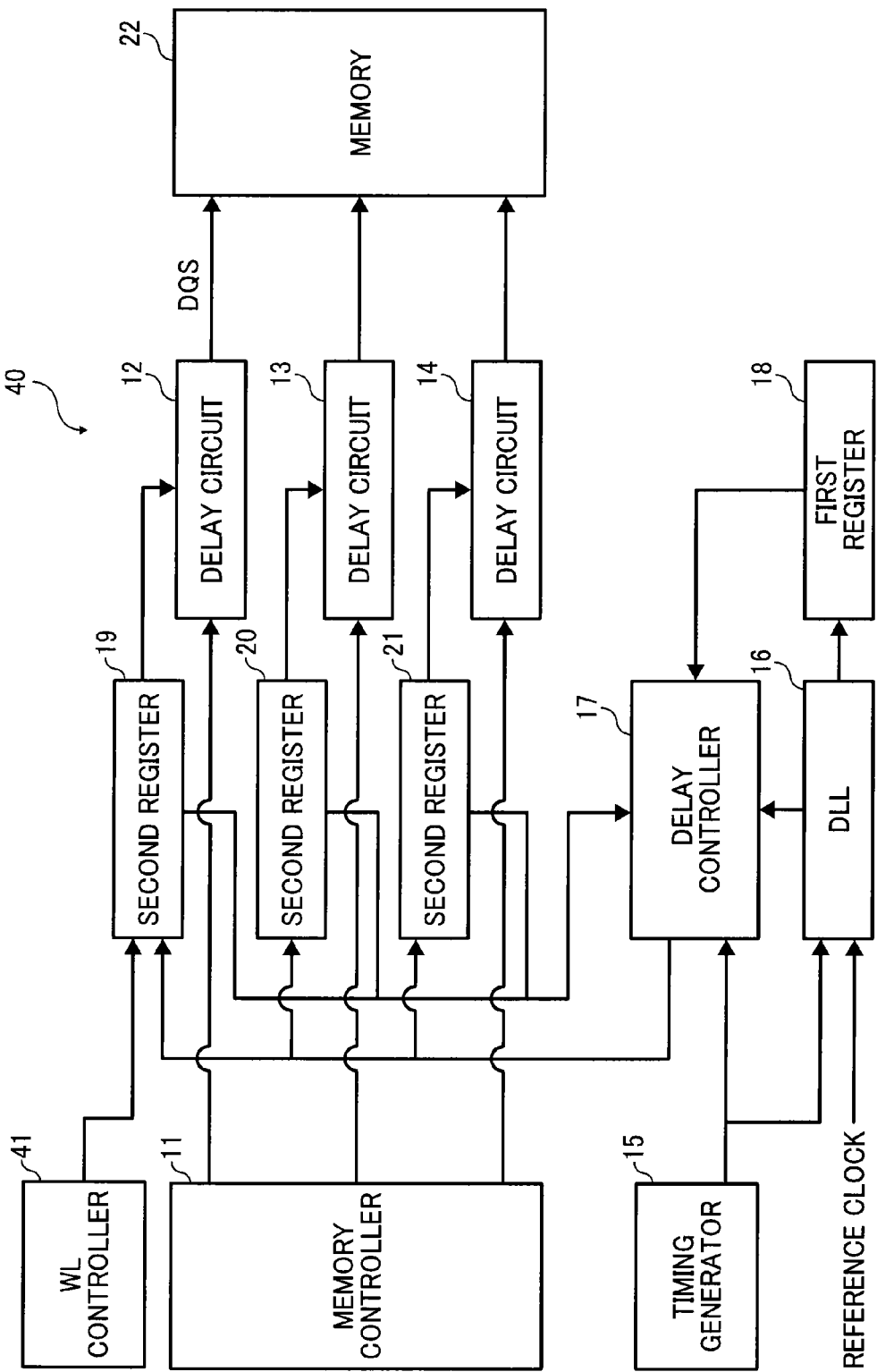
FIG. 4 is a block diagram showing a configuration of a memory control device according to a fourth embodiment.

FIG. 4 is a block diagram showing the main configuration of the memory control device according to the fourth embodiment. The memory control device (controller) 40 includes a WL controller (control circuit) 41 that is connected to a second register 19 as a circuit controlling a strobe delay. Note that, although not shown, instead of the second register 19, the WL control circuit 41 may be connected to another second register (second register 20 or second register 21).

In the above configuration, for example, the WL control circuit 41 inputs a DQS signal (strobe signal) to at least one terminal of the memory 22 via the delay circuit 12 and the second register 19. In this case, the WL control circuit 41 sets a value (+1 or −1) in the second register 19. The value (+1 or −1) is defined as 1 clock time shifted according to the WL command.

According to the present embodiment, since the WL control circuit 41 can set a delay value of the initialization in accordance with the response value of the WL control circuit 41, it is possible to reduce the load on the CPU at the time of the initialization.

In this embodiment, including a circuit capable of changing the delay set according to the response value of the WL command results in reducing one of the loads on the CPU at the time of initialization. This results in increased CPU efficiency.

In the above embodiments, the second registers 19, 20, 21 and delay circuits 12, 13, 14 are provided in units of three. However, these elements are not limited to such number. For example, the second registers and delay circuits may be provided in units of two or more than four.

The above embodiments may be applied to a semiconductor device that needs to set a different delay value to each terminal of a memory.

The invention claimed is:

1. A memory control device including a delay locked loop circuit, the memory control device comprising:
   a plurality of delay circuits to set a delay value for each terminal of a memory, each of the plurality of delay circuits being connected to a terminal of the memory;
   a first register to store a first DLL value output by the delay locked loop circuit;
   a plurality of second registers to store a first setting value to set the delay value for the each terminal of the memory, each of the plurality of second registers being connected to a delay circuit of the plurality of delay circuits; and
   a delay controller to calculate a second setting value based on the first DLL value, a second DLL value output by the delay locked loop circuit after the first DLL value, and the first setting value, and to update the first setting value to the second setting value, wherein
   the delay controller calculates the second setting value at n times, where n is a natural number equal to or greater than 1, using the following equation, $$B_n = (B_{n-1}/A_{n-1}) \times A_n$$

the $A_{n-1}$ is the first DLL value set at n−1 times,
   the $B_{n-1}$ is the first setting value set at the n−1 times,
   the $A_n$ is the second DLL value set at n times, and
   the $B_n$ is the second setting value set at the n times.

2. The memory control device of claim 1, wherein the delay controller detects a difference between the first DLL value and the second DLL value, and determines whether or not to perform the calculation of the second setting value according to an amount of the difference.

3. The memory control device of claim 1, further comprising:
   a write leveling controller to input a strobe signal, the write leveling controller being connected to a second register of the plurality of second registers corresponding to a terminal of the memory, and the write leveling controller setting the delay value in response to a write leveling command to the second register.

4. The memory control device of claim 1, wherein a number of the plurality of second registers is a same as a number of the plurality of delay circuits.

5. The memory control device of claim 1, wherein the delay controller includes a subtractor and an adder with a bit shifter.

6. The memory control device of claim 1, further comprising:

a timing generator to control timing of a calibration execution of the delay locked loop circuit.

7. The memory control device of claim 6, wherein the timing generator is configured to output a timing signal synchronized with a refresh cycle of the memory based on a refresh flag to the delay controller.

8. The memory control device of claim 6, wherein the timing generator is connected to a temperature sensor.

9. A memory control device comprising:
a memory controller to control a memory;
a delay locked loop circuit;
a plurality of delay circuits to set a delay value for each terminal of a memory, each of the plurality of delay circuits being connected to a terminal of the memory;
a first register to store a first DLL value output by the delay locked loop circuit;
a plurality of second registers to store a first setting value to set the delay value for the each terminal of the memory, each of the plurality of second registers being connected to a delay circuit of the plurality of delay circuits; and
a delay controller to calculate a second setting value based on the first DLL value, a second DLL value output by the delay locked loop circuit after the first DLL value, and the first setting value, and to update the first setting value to the second setting value, wherein
the delay controller calculates the second setting value at n times, where n is a natural number equal to or greater than 1, using the following equation, $$B_n = (B_{n-1}/A_{n-1}) \times A_n$$

the $A_{n-1}$ is the first DLL value set at n−1 times,
the $B_{n-1}$ is the first setting value set at the n−1 times,
the $A_n$ is the second DLL value set at n times, and
the $B_n$ is the second setting value set at the n times.

10. A delay controller including a delay locked loop circuit, the delay controller comprising:
a plurality of delay circuits to set a delay value for each terminal of a memory, each of the plurality of delay circuits being connected to a terminal of the memory;
a first register to store a first DLL value output by the delay locked loop circuit;
a plurality of second registers to store a first setting value to set the delay value for the each terminal of the memory, each of the plurality of second registers being connected to a delay circuit of the plurality of delay circuits; and
a delay control circuit to calculate a second setting value based on the first DLL value, a second DLL value output by the delay locked loop circuit after the first DLL value, and the first setting value, and to update the first setting value to the second setting value, wherein
the delay controller calculates the second setting value at n times, where n is a natural number equal to or greater than 1, using the following equation, $$B_n = (B_{n-1}/A_{n-1}) \times A_n$$

the $A_{n-1}$ is the first DLL value set at n−1 times,
the $B_{n-1}$ is the first setting value set at the n−1 times,
the $A_n$ is the second DLL value set at n times, and
the $B_n$ is the second setting value set at the n times.

* * * * *